United States Patent [19]

Tseng et al.

[11] Patent Number: 4,505,023

[45] Date of Patent: Mar. 19, 1985

[54] METHOD OF MAKING A PLANAR INP INSULATED GATE FIELD TRANSISTOR BY A VIRTUAL SELF-ALIGNED PROCESS

[75] Inventors: Wen F. Tseng, Silver Spring; Marvin L. Bark, Baltimore, both of Md.

[73] Assignee: The United States of America as represented by the Secretary of the Navy, Washington, D.C.

[21] Appl. No.: 427,027

[22] Filed: Sep. 29, 1982

[51] Int. Cl.³ .................... H01L 21/20; H01L 21/302
[52] U.S. Cl. ................... 29/571; 29/576 B; 148/1.5; 148/187; 357/91
[58] Field of Search ............... 29/571, 576 B; 148/1.5, 148/187; 357/91

[56] References Cited

U.S. PATENT DOCUMENTS

| | | | |
|---|---|---|---|
| 3,434,021 | 3/1969 | Hofstein | 317/235 |
| 3,455,020 | 7/1969 | Dawson | 29/571 |
| 3,959,025 | 5/1976 | Polinsky | 148/1.5 |
| 4,041,518 | 8/1977 | Shimizu | 357/23 |
| 4,080,618 | 3/1978 | Tango | 357/23 |
| 4,149,307 | 4/1979 | Henderson | 29/571 |
| 4,149,904 | 4/1979 | Jones | 148/1.5 |
| 4,169,270 | 9/1979 | Hayes | 357/23 |
| 4,182,023 | 1/1980 | Cohen | 29/571 |
| 4,224,633 | 9/1980 | Mogi | 357/23 |
| 4,270,136 | 5/1981 | Toyokura | 357/23 |
| 4,309,224 | 1/1982 | Shibata | 148/1.5 |
| 4,327,475 | 5/1982 | Asai et al. | 29/571 |
| 4,356,623 | 11/1982 | Hunter | 29/571 |
| 4,372,032 | 2/1983 | Collins et al. | 29/571 |
| 4,396,437 | 8/1983 | Kwok et al. | 148/1.5 |
| 4,426,765 | 6/1984 | Shahriary et al. | 29/571 |
| 4,426,767 | 1/1984 | Swanson et al. | 29/571 |
| 4,452,646 | 6/1984 | Zuleeg | 148/1.5 |

OTHER PUBLICATIONS

Matsumoto et al., Jap. Jour. Appl. Phys. 21, (Jul. 1982), L-445.
Hirayama et al., Appl. Phys. Letts. 40, (1982), 712.
Tseng et al., IEEE-Electron Device Letts., vol. ED-L-2, (Nov. 1981), pp. 299-301.
Tseng et al., Tech. Paper, 1981, IEDM Meeting, Washington, D.C., Dec. 7-9, 1981.

*Primary Examiner*—Upendra Roy
*Attorney, Agent, or Firm*—Robert F. Beers; William T. Ellis; John L. Forrest

[57] ABSTRACT

A planar compound semiconductor insulated gate field effect transistor and a virtual self-aligned process for making the same. The device includes a semi-insulating InP substrate in which doped source and drain regions separated by a channel region are located. An insulated gate is located on the surface of the substrate over the channel region. The device is fabricated by a virtual or partially self-aligned method wherein the channel region is defined by forming channel alignment insulating layers on the surface of the substrate. Source and drain regions, aligned with the channel alignment layers, are formed in the substrate by ion-implantation. The remainder of the device is formed on the surface of the substrate.

7 Claims, 10 Drawing Figures

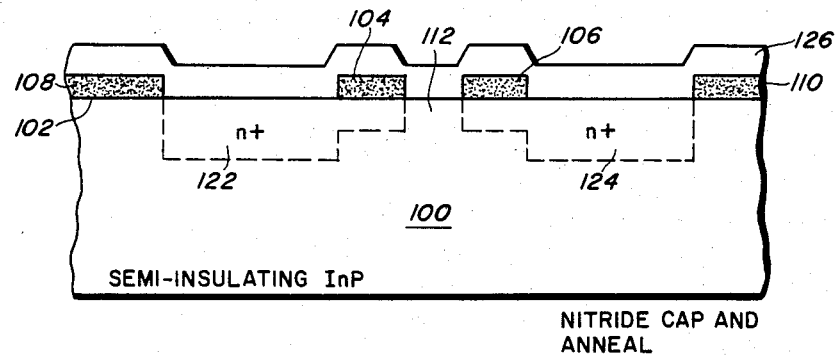
FIG. 4 NITRIDE CAP AND ANNEAL
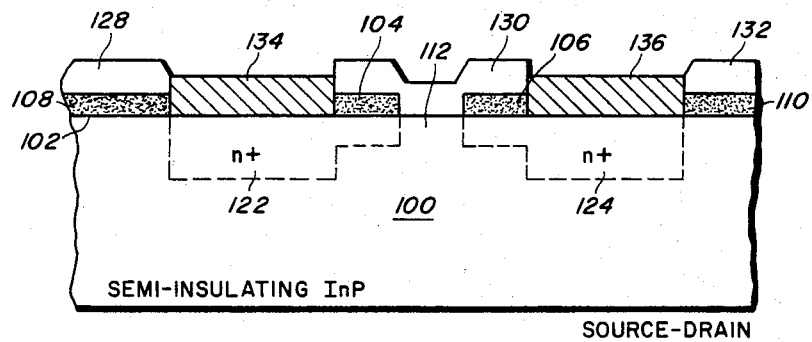
FIG. 5 SOURCE-DRAIN METALIZATION
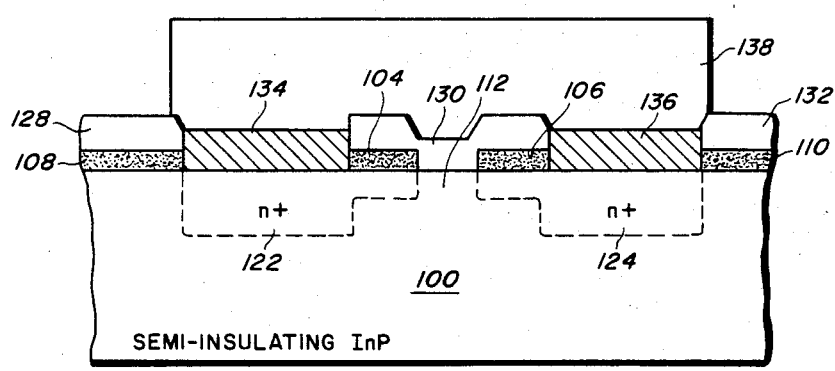
FIG. 6 INTERDEVICE ISOLATION
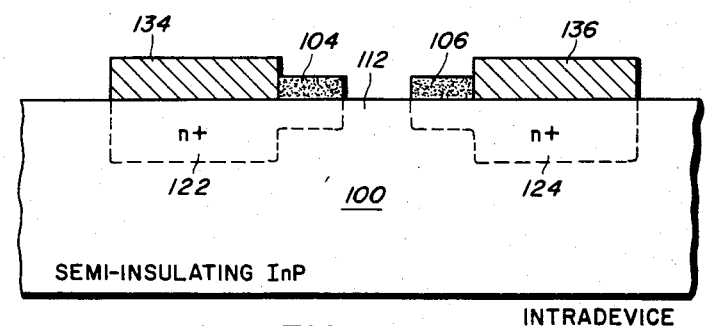
FIG. 7 INTRADEVICE ISOLATION

METHOD OF MAKING A PLANAR INP INSULATED GATE FIELD TRANSISTOR BY A VIRTUAL SELF-ALIGNED PROCESS

BACKGROUND OF THE INVENTION

The present Invention relates, in general, to a novel compound semiconductor insulated gate field effect transistor (IGFET) and to a novel process for making the device.

Indium phosphide (InP) has received increasing attention as a promising semiconductor material in the field of high frequency microwave devices and high speed logic circuits due to its high electron drift velocity. The electron drift velocity for InP is higher than other conventional semiconductors, i.e., silicon (Si) and gallium arsenide (GaAs). Additionally, the use of semi-insulating InP has been found to result in a 100 times reduction in parasitic capacitance as compared to that of conventional p-type substrates.

The microwave frequency and logic speed attainable with a material are roughly proportional to the electron drift velocity. One anticipated use for this material is integration with electro-optic devices. InP has been shown to be an ideal substrate for epitaxial growth of lattice-matched quaternary InGaAsP and ternary InGaAs, both materials used in fabricating electro-optic device structures which operate in the 1.0 to 1.5 micrometer optical wavelength band. Such devices are used to generate optical signals that can be transmitted along optical fibers with very little attenuation and dispersion.

Much work has been directed to developing the fabrication technology and processes required to fabricate InP device structures. The device geometry must be small (one micron or less because of the high speed and high frequency requirements. The speed and frequency of device operation is inversely proportional to the distance traveled by the electrons in the device active region; therefore, submicron device geometries are required.

Planar ion implanted device designs in silicon and other materials have been limited by the ability to define active regions within the crystal material with standard photolithographic techniques. A self-aligned process is often used to avoid critical photolitographic alignment steps. Since the high temperature annealing steps required after the ion-implantation step are detrimental to the InP-insulator interface, the procedures developed for processing self-aligned structures in silicon are not suitable for similar InP strucutres. Due to these problems, prior art InP devices have been non-planar.

The present Invention avoids this problem through the use of a novel "virtual self-aligned" process which results in the production of a novel planar IGFET structure formed on a semi-insulating InP substrate.

SUMMARY OF THE INVENTION

Accordingly, one object of the present Invention is to provide a novel planar compound IGFET device.

Another object is to provide a novel planar semi-insulating InP IGFET device.

Another object is to provide a novel InP IGFET device which minimizes the parasitic capacitance due to gate overlay inherent in prior art devices.

Still another object is to provide a novel InP IGFET device wherein the parasitic capacitance does not increase as the device size is decreased.

Yet another object is to provide a novel process for making a planar IGFET device.

Another object is to provide a novel process for making a planar semi-insulating InP IGFET device.

Another object is to provide a novel process for making a planar semi-insulating InP IGFET device which uses self-aligned techniques but avoids problems due to the degradation of InP-gate insulating layer interfaces.

These and other objectives are achieved by a novel planar compound semiconductor insulated gate field effect transistor according to the present Invention which includes a semi-insulating InP semiconductor substrate including a principal planar surface. A source region doped with a first conductivity type dopant is formed in a first portion of the substrate and extends to the principal surface. A drain region doped with a first conductivity type dopant is formed in a second portion of the substrate and extends to principal surface. The source and drain regions are separated by a channel region in the substrate. An insulation layer is formed on the principal surface and covers at least a contiguous active portion of the channel region extending between the source and drain regions. A gate electrode is formed on the insulation layer over the entirety of the contiguous active portion of the channel region.

These and other objectives are achieved by a novel method of forming a planar semiconductor insulated gate field effect transistor according to the present Invention which includes the step of forming a semiconductor substrate including a principal planar surface. First and second channel alignment insulating layers are then formed on the principal surfaces. The alignment layers are separated from each other. Next, source, drain, and channel regions are formed in the substrate using the first and second alignment layers for alignment; each region extending to the principal surface. The source and drain regions are doped with an impurity of a first conductivity type. Subsequently, a gate insulation layer is formed on the principal surface over the channel region. Finally, a gate electrode layer is formed on the gate insulation layer over the channel regions.

BRIEF DESCRIPTION OF THE DRAWINGS

A more complete appreciation of the Invention and many of the attendant advantages thereof will be readily obtained as the same becomes better understod by reference to the following detailed description when considered in connection with the accompanying drawings, wherein:

FIG. 4 illustrates nitride capping and annealing steps in the process for making a planar IGFET device according to the present Invention;

FIG. 5 illustrates a step of forming source and drain metalizations in the process for making a planar IGFET device according to the present Invention;

FIG. 6 illustrates an interdevice isolation step in the process for making a planar IGFET device according to the present Invention;

FIG. 7 illustrates an intradevice isolation step in the process for making a planar IGFET device according to the present Invention;

DESCRIPTION OF THE PREFERRED EMBODIMENTS

Figure 1:
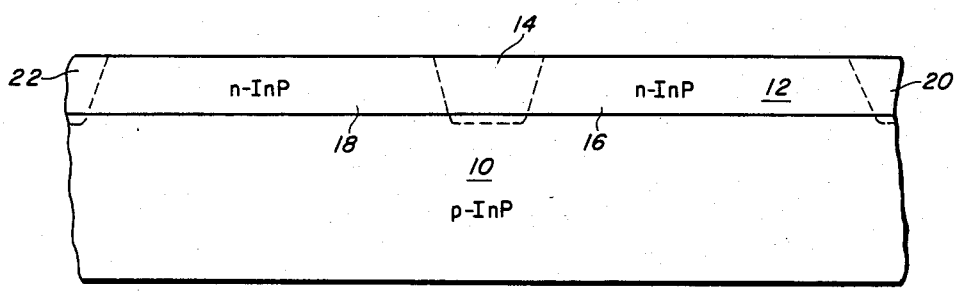
FIG. 1 illustrates a portion of a prior art process for making a prior art non-planar InP IGFET device.
Figure 2:
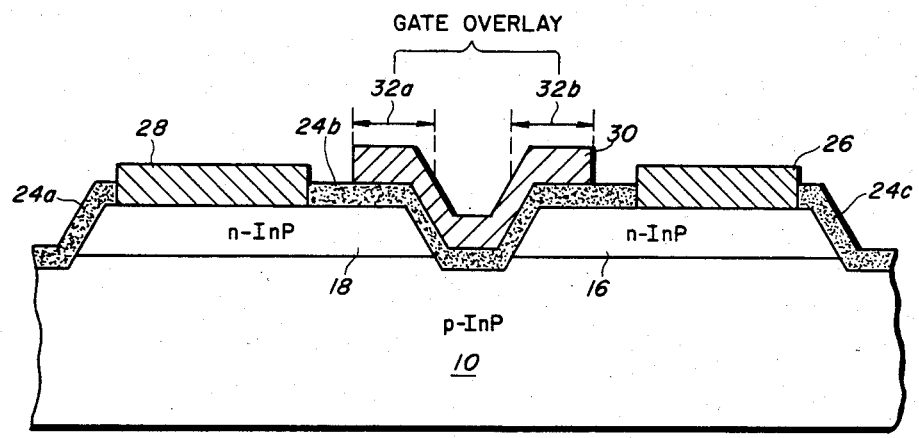
FIG. 2 illustrates a prior art non-planar InP IGFET device formed using the process partially depicted in FIG. 1.

Referring now to the drawings, wherein like reference numerals designate identical or corresponding parts throughout the several views, and more particularly to FIGS. 1 and 2 thereof, a prior art non-planar InP IGFET and the method of making it are depicted and will be briefly described.

In FIG. 1, a layer of n-type InP 12 is formed on a p-type InP substrate 10 by either diffusion or epitaxial growth. The channel regions are then formed by chemically etching to remove the area 14 bounded by the dashed lines thereby defining source and drain regions 16 and 18, respectively. Regions 20 and 22 are also removed during the etching process to providing isolation for the device.

Referring to FIG. 2, an insulation layer is formed over the entire surface of the device and selectively etched to form the insulated regions 24a, 24b, and 24c. Source and drain ohmic contacts 26 and 28 are formed in openings in the insulated layer. Subsequently, a metallic layer is applied to form the gate 30.

The completed prior art structure, as shown in FIG. 2, includes regions 32a and 32b where the gate 30 overlaps the source and drain regions 16 and 18, respectively. Although the overlap regions 32a and 32b produce undesirable overlay capacitance, they are necessary in this type of structure to ensure that the gate 30 completely covers the channel in the substrate 10. In order to increase the speed of the device, the gate length must be reduced which greatly increases the difficulty in properly etching the device to form the channel. Also, as the gate length decreases, the overlay capacitance increases thereby giving rise to significant parasitic capacitance which is detrimental to high speed operation. The present invention completely avoids this problem.

The present invention will now be described in detail with reference to FIGS. 3 through 10 which illustrate the novel method by describing the fabrication of an n-channel, enhancement mode IGFET device according to a preferred embodiment of the present invention. FIG. 10, additionally, illustrates a novel IGFET device fabricated accordingly to the method of the present invention. The present method invention is termed a "virtual self-alignment" process. The self-alignment is achieved in the first processing steps by defining a channel region in the device by surrounding it with insulating layers. These layers remain in place throughout the process and are used to define the gate after various ion-implanted layers are suitably annealed.

Figure 3:
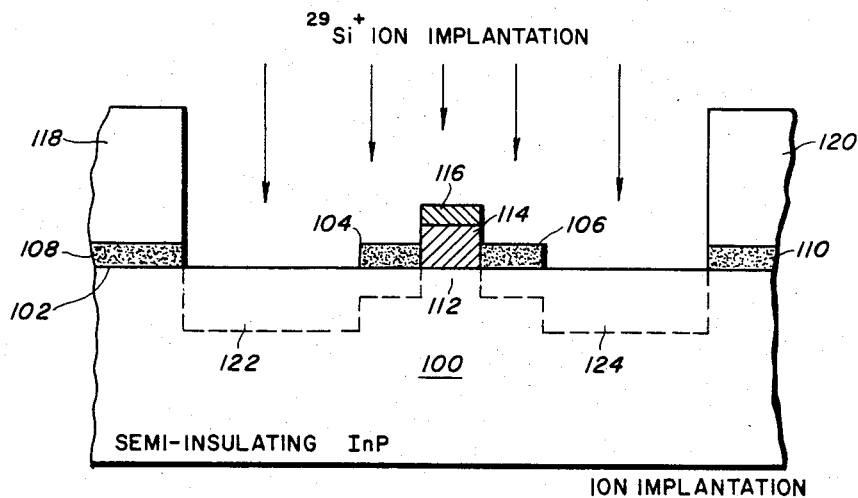
FIG. 3 illustrates an ion-implantation step in the process for making a planar IGFET device according to the present Invention.

In FIG. 3, reference numeral 100 designates a (100) Fe-doped semi-insulating InP substrate having a resistivity greater than $10^7$ ohm-cm. The substrate 100 was grown via the liquid-encapsulation Czochralski (LEC) method as described by Henry and Swiggard, "LEC Growth of InP and GaAs Using PBN Crucibles", *Gallium Arsenide and Related Compounds Conference*, St. Louis, Inst. Phys. Conf. Ser. 33b, pp. 28–36, 1977. The Fe concentration was in the range of $1.3 \times 10^{16}/cm^3$ to $3 \times 10^{16}/cm^3$. After sawing to form a planar surface 102, the (100) wafer was polished using Br-methanol solution on a "Pan-W" polishing pad to remove approximately 100 μm of material.

The polished surface was coated with a dense 700Å to 800Å thick phosphorus-doped $SiO_2$ layer (not illustrated). Standard photolithographic and lift-off techniques were used on the $SiO_2$ layer to form two channel alignment $SiO_2$ layers 104 and 106, spaced an appropriate distance apart such as 2 to 10 μm, and to form two interdevice isolation $SiO_2$ layers 108 and 110. The channel alignment layers 104 and 106 act to define the channel region 112 lying therebetween and will remain in place throughout the process.

The channel region 112 was protected during subsequent steps by forming a 2000Å thick aluminum layer 114 covered with 600Å of gold 116 between the channel alignment layers 104 and 106. The metal layers 114 and 116 had an appropriate length, such as 250 μm. The interdevice region was protected by thick photoresist layers 118 and 120 formed on the interdevice $SiO_2$ isolation layers 102 and 110, respectively.

Two n+ source and drain beds 122 and 124, respectively, were formed in the substrate 100 by means of ion implantation as shown in FIG. 3. The ion implantation was performed with $^{29}Si^+$ in two steps: a first step at 120 keV to a dose of $6.35 \times 10^{12}/cm^2$ and a second step at 40 keV to a dose of $3 \times 10^{12}/cm^2$. The ion beam energies were chosen such that the low energy (40 keV) ions would not penetrate through the $SiO_2$ channel alignement layers 104 and 106, and such that the high energy (120 keV) ions would penetrate through the $SiO_2$ layers 104 and 106 but not through the aluminum 114 and gold 116 layers. The ion doses were chosen so that the peak concentration of implanted atoms was kept below $1 \times 10^{18}/cm^3$ to prevent lateral spreading of the implanted atoms. Thus, sharply defined stepped doping profiles were created in the source and drain beds 122 and 124, respectively, as shown.

Referring to FIG. 4, the photoresist layers 118 and 120 were stripped and the aluminum 114 and gold 116 layers were etched off with a dilute HCl solution after ion-implantation. The exposed surface of the substrate 100 and the remaining $SiO_2$ layers 104, 106, 108, 110 were capped with a plasma nitride layer 126 and annealed at 700° C. for 25 minutes in forming gas.

Using standard photoresist methods, the planar nitride layer 126 was removed between the $SiO_2$ layers 108 and 104, and between the $SiO_2$ layers 106 and 110 to form windows exposing portions of the substrate 100 over the source and drain beds 122 and 124, respectively, as shown in FIG. 5. The plasma nitride layers 128, 130 and 132 are left intact. Source and drain contacts 134 and 136, respectively, were formed in the windows in the plama nitride layer by standard lift-off techniques. These contacts comprised 2000Å of AuGe (88% Au, 12% Ge) followed by 400Å of nickel. Alternatively, AuGe contacts with no nickel coating can be used. After forming the contacts, the wafer was placed on a strip heater and sintered at 380° C. for one minute in forming gas. If desired, at this point current leakage tests between the source and drain contacts 134 and 136, respectively, and between these contacts and those of adjacent devices can be performed. Current leakages of less than $20\mu$ microamperes are acceptable.

Referring to FIG. 6, a thick photoresist layer 138 was formed to completely cover the source and drain contacts 134 and 136 and the area therebetween. The layer 38 extended slightly over the nitride layers 128 and 132 to protect the outside edges of the contacts 134 and 136. The nitride layers 128 and 132 were removed by plasma etching, and the $SiO_2$ layers 108 and 110 were removed by chemical etching. The photoresist layer 138 was then stripped away.

Figure 8:
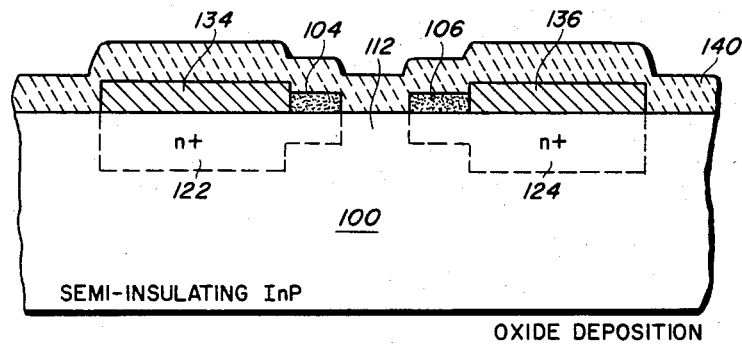
FIG. 8 illustrates an oxide deposition step in the process for making a planar IGFET device according to the present Invention.

Utilizing the very large difference in sputtering rates of E-gas ($SiF_4/2\%$ $O_2$) for $SiO^2$ and nitride, the nitride layer 130 was removed producing the structure shown in FIG. 7. The wafer was then etched in a solution of $HIO_3$ (5grams): $H_2O$ (20 ml) until no source to drain leakage current was observed. At this point, the wafer was given a 10 second dip in dilute HCl and placed in an $SiO_2$ reactor where a 1000Å layer of $SiO_2$ 140 was grown at 210° C. as shown in FIG. 8.

Figure 9:
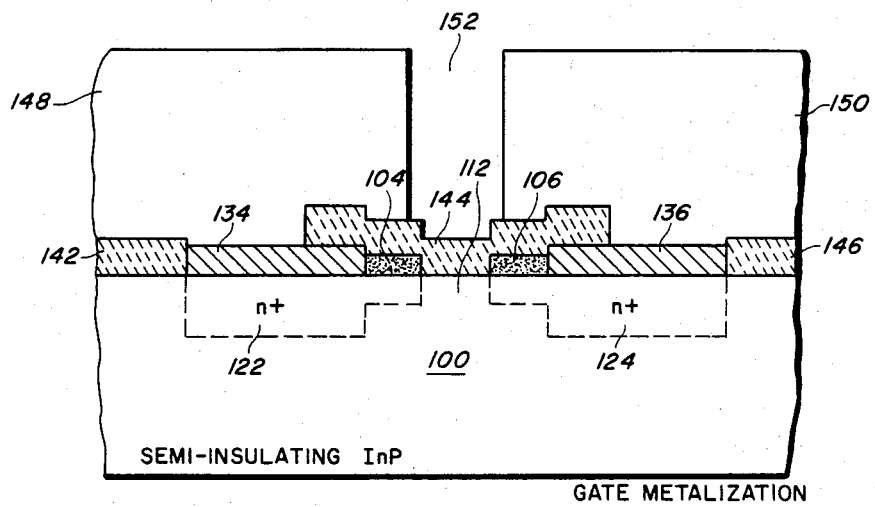
FIG. 9 illustrates a gate metalization step in the process for making a planar IGFET device according to the present Invention.
Figure 10:
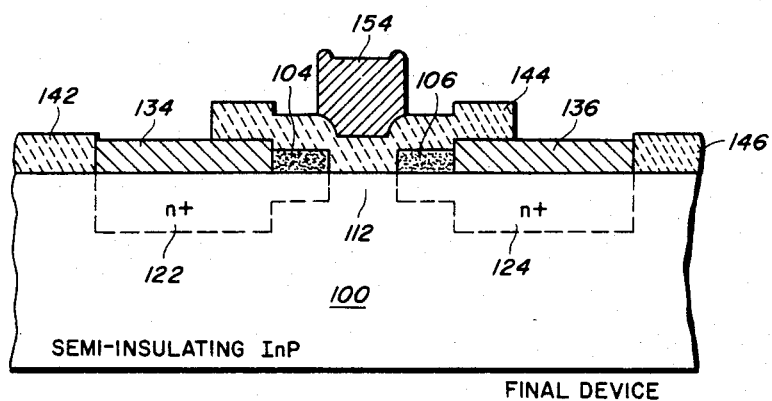
FIG. 10 illustrates a novel InP IGFET device according to the present Invention which was produced via the process illustrated in FIGS. 3 through 9.

Using photoresist, portions of the $SiO_2$ layer 140 were removed to form windows above the source and drain electrodes 134 and 136, thereby leaving interdevice isolation $SiO_2$ layers 142 and 146, and a gate insulation $SiO_2$ layer 144 as shown in FIG. 9. Thick photoresist layers 148 and 150 were formed as shown leaving an opening 152 over the portion of the gate insulation $SiO_2$ layer 144 above the channel region 112. A 3000Å thick aluminum gate 154 was deposited through the opening 152 onto the upper surface of the gate insulation layer 144. The length of the gate 154 was about 0.2 to 0.3 $\mu m$ greater than the spacing between the channel alignment layers 104 and 106 so as to insure that the gate covers the entire channel region 112 with minimum overlap. The photoresist layers 148 and 150 were stripped off leaving the completed device shown in FIG. 10.

Upon testing, the device shown in FIG. 10 exhibited the following:
1. square-law characteristics;
2. an inverse-relationship between transconductance ($g_m$) and gate length; and
3. high surface channel electron mobilities-on the order of 1000 $cm^2$/V-Sec.

Although the above process has been described with reference to the fabrication of an n-channel enhancement mode device, it should be understood that the process is equally applicable to the fabrication of p-channel devices and depletion mode devices. Additionally, the above process is not limited to FET devices or to devices formed on InP substrates as the method is equally applicable to the fabrication of other similar devices on any compound semiconductor substrate.

Obviously, numerous (additional) modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of forming a planar InP semiconductor insulated gate field effect transistor comprising the steps of:

forming an InP semiconductor substrate including a principal planar surface;
   forming first and second channel alignment insulating layers on said principal surface, said first and second alignment layers having opposing edges which define the intersection of a channel region in said substrate with said principal surface, said opposing edges being separated by a distance equal to the length of said channel region;
   forming a masking layer on said principal surface between said first and second alignment layers;
   implanting ions of an N conductivity type dopant into said substrate through said principal surface to form source and drain beds of an N type conductivity in said substrate, said source and drain beds extending to said principal surface, said source and drain beds including opposing edges which are aligned with said opposing edges of said first and second alignment layers, said source and said drain beds being separated by said channel region, said masking layer preventing said ions from being implanted in said channel region; removing said masking layer; annealing said source and drain beds; forming a gate insulation layer on said principal surface over at least a contiguous active portion of said channel region extending between said source bed and said drain bed; and forming a gate electrode layer on said gate insulation layer over the entirety of said contiguous active portion of said channel region.

2. The method of forming a planar InP semiconductor insulated gate field effect transistor as recited in claim 1, wherein prior to said step of forming a gate insulation layer, said method includes the steps of:
   forming a source ohmic contact on said principal surface in contact with said source bed; and
   forming a drain ohmic contact on said principal surface in contact with said drain bed.

3. A method of forming a planar InP semiconductor insulated gate field effect transistor comprising the steps of:

forming a InP semiconductor substrate including a principal planar surface;
   forming first and second channel alignment insulatating layers on said principal surface, said first and second alignment layers have opposing edges which define the intersection of a channel region in said substrate with principal surface, said opposing edges being separated by a distance equal to the length of said channel region;
   forming a masking layer on said principal surface between said first and second alignment layers;
   implanting ions of a first conductivity type dopant into said substrate through said principal surface to form source and drain beds of an N type conductivity in said substrate, said source and drain beds extending to said principal surface, said source and drain beds including opposing edges which are aligned with said opposing edges of said first and second alignment layers, said source and said drain beds being separated by said channel region,
   said masking layer preventing said ions from being implanted in said channel region;
   removing said masking layer;
   annealing said source and drain beds;
   forming a source ohmic contact on said principal surface in contact with said source bed;

forming a drain ohmic contact on said principal surface in contact with said drain bed;
forming a gate insulation layer on said principal surface over at least a contiguous active portion of said channel region extending between said source bed and said drain bed; and
forming a gate electrode layer on said gate isulation layer over the entirety of said contiguous active protion of said channel region.

4. A method of forming a planar InP semiconductor insulated gate field effect transistor comprising the steps of:
forming a semiconductor substrate including a principal planar surface;
forming first and second channel alignment insulating layers on said principal surface, said first and second alignment layers having opposed edges which define the intersection of a channel region in said substrate with said principal surface, said opposing edges being separated by a distance equal to the length of said channel region;
forming a masking layer on said principal surface between said first and second alignment layers;
implanting ions of an N conductivity type dopant into said substrate through said principal surface to form source and drain beds in said substrate, said masking layer preventing said ions from being implanted in said channel region;
removing said masking layer;
annealing said source and drain beds;
forming source and drain ohmic contacts on said principal surface in respective contact with said source and drain beds;
forming a gate insulation layer on said principal surface over at least a contiguous active portion of said channel region extending between said source bed and said drain bed; and
forming a gate electrode layer on said gate insulation layer over the entirety of said contiguous active portion of said channel region.

5. The method of forming a planar InP semiconductor insulated gate field effect transistor as recited in claims 3 or 4, wherein said step of forming said masking layer includes the steps of:
forming an aluminum layer on said principal surface between said first and second alignment layers; and
forming a gold layer on said aluminum layer.

6. The method of forming a planar InP semiconductor insulated gate field effect transistor as recited in claims 3 or 4, wherein said N conductivity type dopant is $^{29}Si$.

7. The method of forming a planar InP semiconductor insulated gate field effect transistor as recited in claims 1, 2, 3, or 4, wherein said step of forming a semiconductor substrate includes the steps of:
forming an Fe doped semi-insulating wafer, said wafer having an Fe concentration lying in the range of 1.3 to $3 \times 10^{16}/cm^3$, said wafer having a resistivity greater than $10^7$ ohm-cm; and
polishing a surface of said wafer to form said principal planar surface.

* * * * *